(12) United States Patent
Soh et al.

(10) Patent No.: US 11,038,380 B2
(45) Date of Patent: Jun. 15, 2021

(54) SPLIT-RING RESONATOR WITH INTEGRATED MAGNETIC TUNNEL JUNCTION FOR HIGHLY SENSITIVE AND EFFICIENT ENERGY HARVESTING

(71) Applicant: National University of Singapore, Singapore (SG)

(72) Inventors: Wee Tee Soh, Singapore (SG); Hyunsoo Yang, Singapore (SG)

(73) Assignee: National University of Singapore, Singapore (SG)

( * ) Notice: Subject to any disclaimer, the term of this patent is extended or adjusted under 35 U.S.C. 154(b) by 22 days.

(21) Appl. No.: 16/409,329

(22) Filed: May 10, 2019

(65) Prior Publication Data
US 2019/0348869 A1   Nov. 14, 2019

(30) Foreign Application Priority Data

May 10, 2018   (SG) .......................... 10201803943W

(51) Int. Cl.
*H02J 50/20*   (2016.01)
*H01L 43/02*   (2006.01)
(Continued)

(52) U.S. Cl.
CPC .......... *H02J 50/20* (2016.02); *H01F 10/3254* (2013.01); *H01F 10/3272* (2013.01);
(Continued)

(58) Field of Classification Search
CPC .. H02J 50/20; H02J 50/10; H02J 17/00; H02J 7/025; H01F 10/3254; H01F 10/3272;
(Continued)

(56) References Cited

U.S. PATENT DOCUMENTS

2011/0181303 A1* 7/2011 Xiao .................. G01R 33/1284
324/656
2014/0266967 A1   9/2014 Ramahi et al.
(Continued)

FOREIGN PATENT DOCUMENTS

CN   105895675 A   8/2016
CN   106469860 A   3/2017
(Continued)

OTHER PUBLICATIONS

Alavikia, Babak, et al., "Complementary Split Ring Resonator Arrays for Electromagnetic Energy Harvesting," AIP Publishing LLC, Applied Physics Letters, vol. 107, Jul. 21, 2015, pp. 1-5.
(Continued)

*Primary Examiner* — Carlos Amaya
(74) *Attorney, Agent, or Firm* — Cesari and McKenna, LLP; James A. Blanchette

(57) ABSTRACT

In example embodiments, an RF-to-DC converter includes one or more unit cells that integrate a spintronic element (e.g., a magnetic tunnel junction (MTJ)) into a conductor ring RF energy absorber (e.g., a split-ring resonator (SRR)). A RF-to-DC converter that includes one or more MTJ-integrated SRR unit cells may provide compactness, as each unit cell includes its own independent SRR and integrated MTJ; scalability, as multiple unit cells may be connected into an array to increase DC power output; and energy harvesting efficiency, as a MTJ may be much more sensitive than a Schottky diode and the SRR of each unit cell may directly feed energy to a MTJ without impedance matching circuits.

20 Claims, 17 Drawing Sheets

(51) Int. Cl.
| | |
|---|---|
| *H01L 43/10* | (2006.01) |
| *H02J 50/10* | (2016.01) |
| *H03B 15/00* | (2006.01) |
| *H01F 10/32* | (2006.01) |

(52) U.S. Cl.
CPC .............. *H01L 43/02* (2013.01); *H01L 43/10* (2013.01); *H02J 50/10* (2016.02); *H03B 15/006* (2013.01); *H03B 2200/0016* (2013.01)

(58) Field of Classification Search
CPC .................. H01L 43/10; H03B 15/006; H03B 2200/0016
See application file for complete search history.

(56) References Cited

U.S. PATENT DOCUMENTS

| | | | |
|---|---|---|---|
| 2016/0308402 | A1 | 10/2016 | Alavikia et al. |
| 2017/0346193 | A1 | 11/2017 | AlShareef et al. |

FOREIGN PATENT DOCUMENTS

| | | | |
|---|---|---|---|
| EP | 3046181 | A2 | 7/2016 |
| WO | WO-2018021973 | A2 | 2/2018 |

OTHER PUBLICATIONS

Aljaloud, Khaled, et al., "A Compact Rectenna Using Split Ring Resonator for Energy Harvesting," IEEE, IEEE Xplore, 2017 International Workshop on Electromagnetics: Applications and Student Innovation Competition, London, UK, May 30, 2017-Jun. 1, 2017, pp. 1-2.

Fang, Bin, et al., "Giant Spin-Torque Diode Sensitivity in the Absence of Bias Magnetic Field," Nature Communication, Article, Apr. 7, 2016, pp. 1-7.

Fang, Bin, et al., "Spintronic Nano-Scale Harvester of Broadband Microwave Energy," arXiv.org, Jan. 1, 2018, pp. 1-29.

Fowler, C., et al., "A Metamaterial-Inspired Approach to RF Energy Harvesting," arXiv.org, May 7, 2017, pp. 1-11.

Fu, L., et al., "Microwave Reflection Imaging Using a Magnetic Tunnel Junction Based Spintronic Microwave Sensor," American Institute of Physics, Applied Physics Letters, vol. 101, Dec. 5, 2012, pp. 1-4.

Hemour, Simon, et al., "Towards Low-Power High-Efficiency RF and Microwave Energy Harvesting," IEEE, IEEE Transactions on Microwave Theory and Techniques, vol. 62, No. 4, Apr. 2014, pp. 965-976.

Maedler, Carsten, et al., "Wireless Transfer of Power by a 35GHz Metamaterial Split-Ring Resonator Rectenna," arXiv.org, Aug. 4, 2016, pp. 1-8.

Miwa, S., et al., "Highly Sensitive Nanoscale Spin-Torque Diode," Nature Materials, Articles, vol. 13, Oct. 20, 2013, pp. 50-56.

Shi, Yanyan, et al., "Design of a Novel Compact and Efficient Rectenna for WiFi Energy Harvesting," Progress in Electromagnetics Research C, Pier C, vol. 83, Jan. 2018, pp. 57-70.

Tulapurkar, A. A., et al., "Spin-Torque Diode Effect in Magnetic Tunnel Junctions," Nature Publishing Group, Nature, Letters, vol. 438, Nov. 17, 2005, pp. 339-342.

\* cited by examiner

SPLIT-RING RESONATOR WITH INTEGRATED MAGNETIC TUNNEL JUNCTION FOR HIGHLY SENSITIVE AND EFFICIENT ENERGY HARVESTING

RELATED APPLICATIONS

The present application claims priority to Singapore Patent Application No. 10201803943 W, filed by Applicant National University of Singapore on May 10, 2018, the contents of which are incorporated by reference herein in their entirety.

BACKGROUND

Technical Field

The present disclosure relates generally to conversion of radio-frequency (RF) energy into direct current (DC) power, and more specifically to RF-to-DC converters that integrate a spintronic element (e.g., a magnetic tunnel junction (MTJ)) that operates as a rectifier into a structure (e.g., a split-ring resonator (SRR)) that acts as a RF energy absorber.

Background Information

With the prevalence of RF wireless and telecommunication technologies, there is often considerable ambient (e.g., waste) RF energy that, if it could be efficiently harvested, would provide an environmental-friendly power solution. Harvesting RF energy may be a desirable power source for a number of types of devices, including wireless sensor networks (WSNs). Sensors using RF harvesting technology may work in a variety of situations, and have the potential for long sensor life cycles. Harvesting RF energy provides advantages over other energy harvesting technologies. For example, it may provide greater flexibility, as RF can be obtained from ambient sources, or from a dedicated transmitter if there is not sufficient ambient RF available. Given its potential, RF-to-DC conversion has become a hot spot of research.

Conventional RF-to-DC converters typically include Schottky diodes that operate as rectifiers, and separate antennas that operate as RF energy absorbers. A Schottky diode is a semiconductor diode with a very fast switching action, but a low forward voltage drop. In a Schottky diode, a semiconductor-metal junction is formed, creating a Schottky barrier. The semiconductor acts as a cathode and the metal side acts as the anode of the diode. The cathode and anode are coupled to the antenna that absorbs RF energy and feeds it to the Schottky diode. The antenna is typically a separate entity, and impedance matching circuits are typically required to solve impedance matching issues.

While RF-to-DC converters including Schottky diodes are functional, they suffer a number of disadvantages. Schottky diodes, and their required circuitry (e.g., the impedance matching circuits), are relatively large, and pose significant obstacles to device scaling. Further, Schottky diode-based devices are already rapidly approaching to their theoretical limits for RF-to-DC conversion. Accordingly, there is little room for further energy harvesting efficiency improvement.

Thus, there is a need for a new type of RF-to-DC converter that may provide improved compactness, scalability, energy harvesting efficiency, and/or other advantages.

SUMMARY

In example embodiments, an RF-to-DC converter includes one or more unit cells that integrate a spintronic element (e.g., a magnetic tunnel junction (MTJ)) into a conductor ring RF energy absorber (e.g., a split-ring resonator (SRR)). A RF-to-DC converter that includes one or more MTJ-integrated SRR unit cells may provide improved compactness, as each unit cell includes its own independent SRR and integrated MTJ; increased scalability, as multiple unit cells may be connected into an array to increase DC power output; and improved energy harvesting efficiency, as a MTJ may be much more sensitive than a Schottky diode and the SRR of each unit cell may directly feed energy to a MTJ without impedance matching circuits.

In one specific example embodiment, an RF-to-DC converter includes one or more MTJ-integrated SRR unit cells. Each MTJ-integrated SRR unit cell includes a conductor ring for absorbing RF energy, having a first electrode, a second electrode, and a gap that electrically uncouples the first electrode and second electrodes from each other. A MTJ element for converting absorbed RF energy to DC power is electrically connected to the first electrode and the second electrode. The MTJ element includes a MTJ that covers at least a portion of an area of the MTJ element.

It should be understood that a variety of additional features and alternative embodiments may be implemented other than those discussed in this Summary. This Summary is intended simply as a brief introduction to the reader, and does not indicate or imply that the examples mentioned herein cover all aspects of the disclosure, or are necessary or essential aspects of the disclosure.

BRIEF DESCRIPTION OF THE DRAWINGS

The description below refers to the accompanying drawings of example embodiments, of which.

DETAILED DESCRIPTION

Definitions

As used herein, the term "substrate" should be interpreted to refer to a structure to which one or more materials, or one or more layers of material, may be deposited thereon.

As used herein, the term "layer" should be interpreted to refer to a level or to thickness of a structure that is distinguishable from another level or thickness of another structure. A layer may comprise the same, or different materials, from the other structure. The layer and the other structure may be the same or different in properties (e.g., size, shape, etc.), as long as they are distinguishable from each other. A layer may comprise one or more sub-layers or intermediate layers, which themselves may also be distinguishable from adjacent layers.

As used herein, the terms "coupled" and "connected" are intended to cover both directly connected, or connected through one or more intermediate structures, unless otherwise stated.

As used herein, the term "and/or" (e.g., as in "X and/or Y") should be interpreted to mean either "and" or "or" (e.g., as in "X and Y" or "X or Y").

Further, as used herein, the term "substantially" should be understood to include, exactly or completely, and also to include within a reasonable variation, defined as a variation of no more than +/−5% when used in reference to a value.

Example Embodiments

Figure 1:
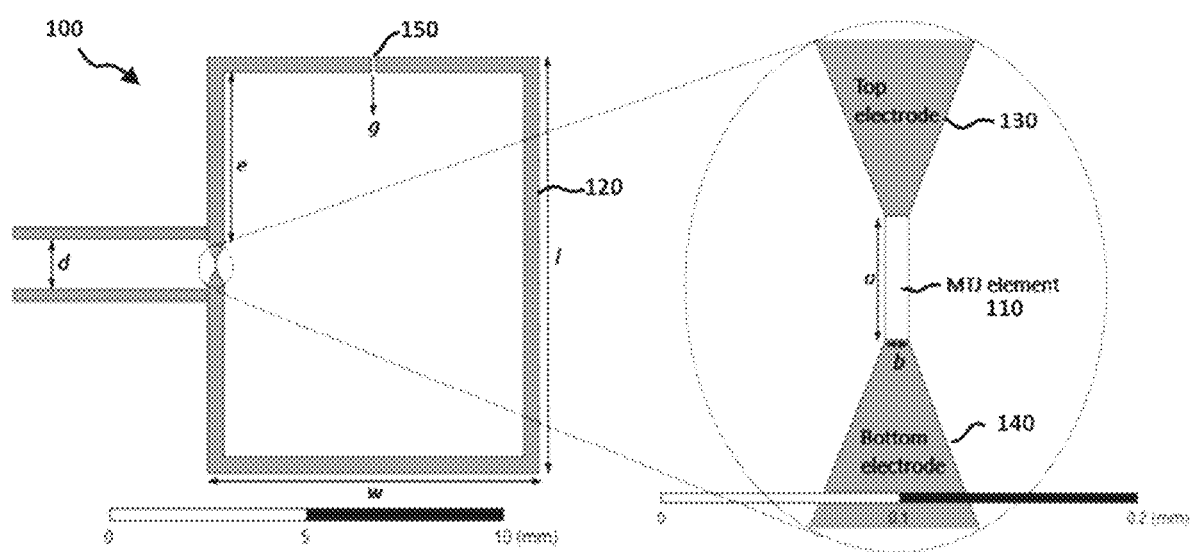
FIG. 1 is a schematic diagram of a MTJ-integrated SRR that may be used as a unit cell of an RF-to-DC converter, with an insert showing an expanded view of the MTJ.

FIG. 1 is a schematic diagram of a MTJ-integrated SRR 100 that may be used as a unit cell of an RF-to-DC converter, with an insert showing an expanded view of the MTJ. The MTJ-integrated SRR 100 includes a smaller MTJ element 110 electrically connected to a larger ring 120 made of an electrical conductor (e.g., copper) by a first electrode (e.g., a "top" electrode) 130 and a second electrode (e.g., a "bottom" electrode) 140. The first and second electrodes 130, 140 are electrically DC-uncoupled from each other by a gap 150 in the conductor ring 120. The entire MTJ-integrated SRR 100 is deposited on a substrate (e.g., a silicon oxide ($SiO_2$) substrate).

Dimensions (e.g., a, b, d, e, g, w, l in FIG. 1) of the MTJ-integrated SRR 100 may vary in different embodiments, depending on the operation frequencies of interest and a variety of other factors. In one example embodiment, the MTJ element 110 may have a height a of substantially 50 μm and a width b of substantially 10 μm, and a thickness of a few hundred nanometers. The conductor ring 120 may have a height l of substantially 10 mm, a width w of substantially 8.5 mm, a gap g of substantially 0.1 mm (gap), a spacing of leads d of substantially 1.2 mm, with the MTJ element 110 positioned at the mid-point of the length l such that distance e is substantially equal to ½ (l−d). The width of the conductor ring that forms the SRR may be substantially 0.4 mm. The thickness of the SRR 120 may be between a few hundred nanometers to a few microns. The substrate (e.g., $SiO_2$) the MTJ-integrated SRR 100 is deposited on may be substantially 0.5 mm thick.

Figure 2:
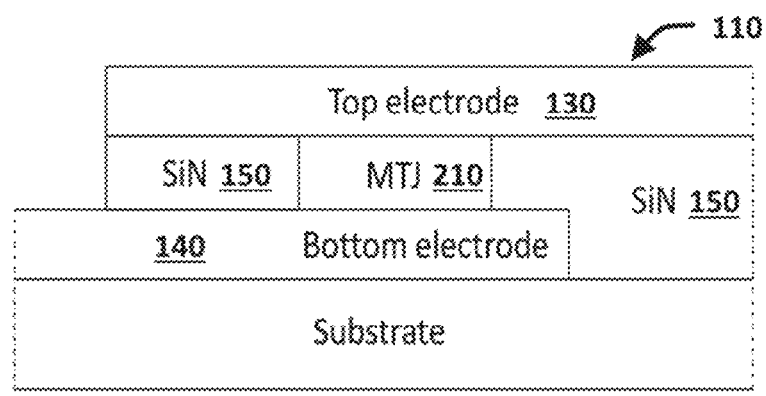
FIG. 2 is a cross-sectional view of the MTJ element of FIG. 1.

FIG. 2 is a cross-sectional view of the MTJ element 110 of FIG. 1. As can be seen, the first electrode (e.g., the "top" electrode) 130 extends above the MTJ 210 while the second electrode (e.g., the "bottom" electrode) 140 extend below the MTJ 210, sandwiching it in between, upon a substrate. Each electrode 130, 140 is made of an electrical conductor (e.g., copper) and is electrically connected to the conductor ring 120 (not shown in FIG. 2). The electrodes 130, 140 may be a few hundred nanometers thick. The MTJ 210 may be otherwise electrically isolated by the passivation layers (e.g., silicon nitride (SiN) layers) 150. The MTJ 210 may not fully cover the area of the MTJ element 110 (a mm×b mm). For example, the MTJ 210 may be nano-sized and only cover a small portion of this area. The MTJ 210 may include a multi-layered MTJ as discussed further below.

Figure 3:
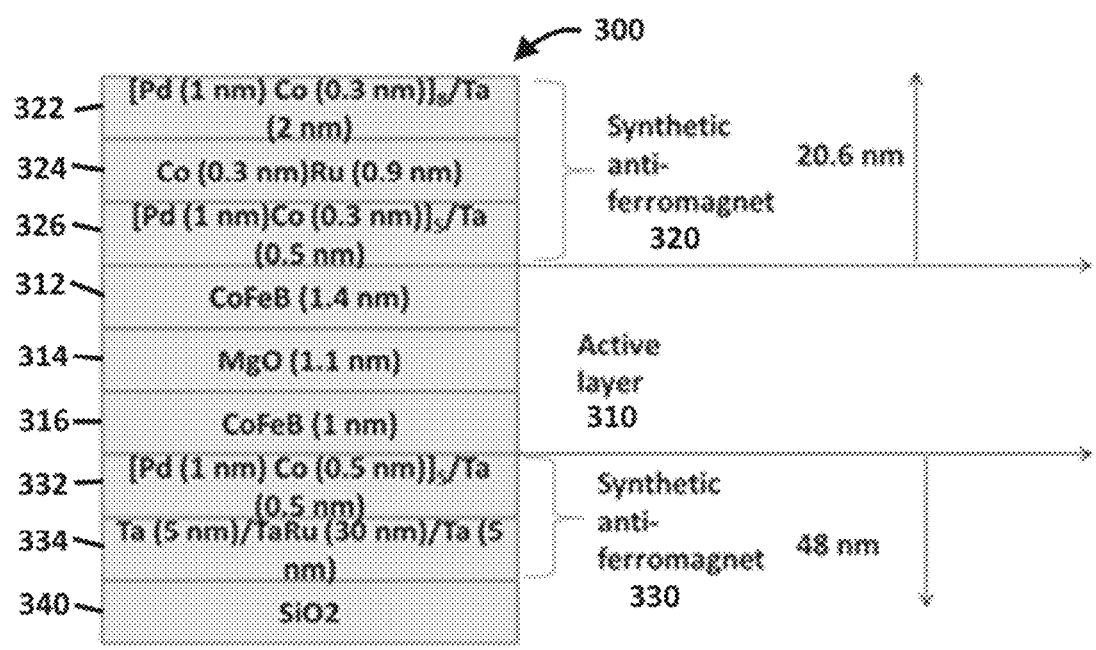
FIG. 3 is an example layer stack of a MTJ of the MTJ element of FIG. 1.

FIG. 3 is an example layer stack 300 of a MTJ 210 of the MTJ element 110 of FIG. 1. The example layer stack includes an active layer 310 sandwiched in-between first (e.g., top) and second (e.g., bottom) synthetic anti-ferromagnet layers 320, 330, all upon a substrate 340. The active layer 310 may include magnetically-free and magnetically fixed layers, namely free and fixed magnetic layers 312, 316 (e.g., cobalt iron boron alloy (CoFeB) (1.4 nm and 1 nm) layers), separated by an oxide layer (e.g., a magnesium oxide (MgO) (1.1 nm) layer) 314. The first (e.g., top) synthetic anti-ferromagnet layer 320 may include [palladium (Pd) (1 nm)/cobalt (Co) (0.3 nm)]$_8$/tantalum (Ta) (2 nm or 0.5 nm) layers 322, 326 separated by a cobalt/ruthenium (Co/Ru) (0.9 nm) layer. The second (e.g., bottom) anti-ferromagnet layer 330 may include a [Pd (1 nm)/Co (0.5 nm)]$_5$/Ta (0.5 nm) layer 332 disposed upon a Ta (5 nm)/TaRu (30 nm)/Ta (5 nm) layer 334. While specific layer compositions and thickness are provided in relation to the example layer stack 300 of FIG. 3, it should be remembered that a wide variety of other layer compositions and thickness may be used in other embodiments.

Figure 4:
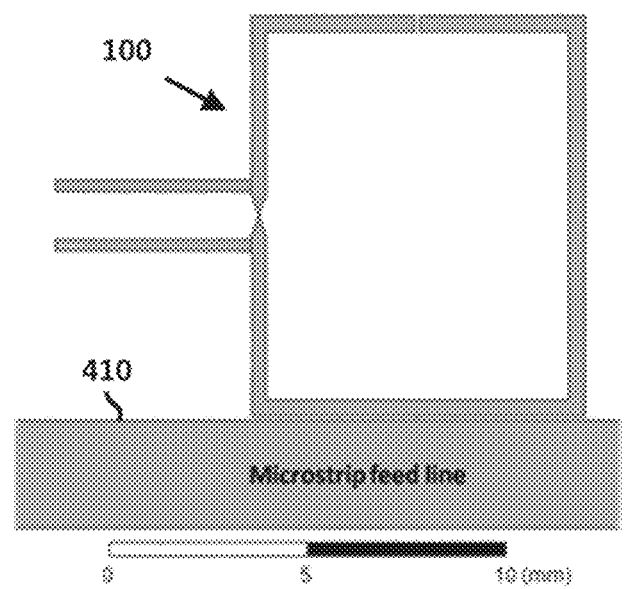
FIG. 4 is a schematic diagram of an MTJ-integrated SRR adjacent to a microstrip feed line 410 that inductively feeds RF energy to its SRR.

The example MTJ-integrated SRR 100 of FIGS. 1-3 may operate to convert ambient (e.g., waste) or dedicated RF energy into useful DC power. During operation of the MTJ-integrated SRR 100, RF energy is fed into the SRR either as a plane wave incident on it or through a nearby transmission feed line (e.g., a microstrip feed line). FIG. 4 is a schematic diagram of an MTJ-integrated SRR 100 adjacent to a microstrip feed line 410 that inductively feeds RF energy to its SRR.

When the frequency of the incident RF coincides with the intrinsic resonance frequency of the MTJ-integrated SRR 100, maximum RF energy will be transferred to the latter. The MTJ-integrated SRR 100 can be represented by an equivalent circuit consisting of a resistor R (due to the MTJ and conductor resistance), an inductor L (due to the conductor ring 120) and a capacitor C (due to the gap 150) connected in series. Hence, resonance of the MTJ-integrated SRR 100 is due to RLC circuit resonance. By changing the dimensions of the SRR (e.g., such as l, w, g, e, and/or ring-width) one can change the resonance frequency $f=1/2\pi\sqrt{LC}$ to match the RF frequency to be harvested. For example, changing the dimensions of the SRR one may change the resonance frequency to match the 2.4 GHz frequency of the popular WiFi-band.

Figure 5:
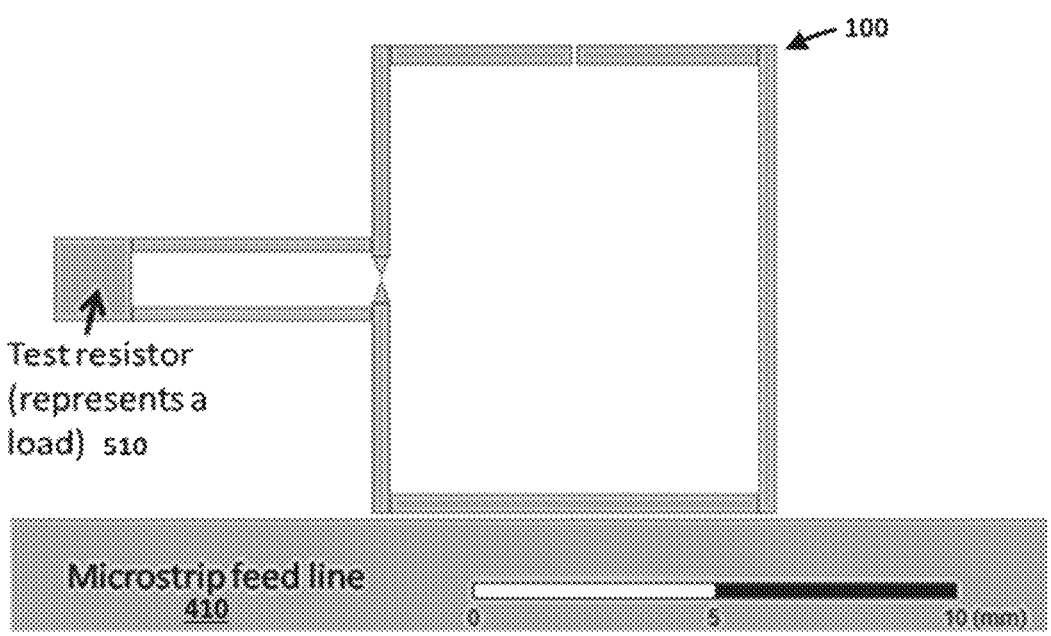
FIG. 5 is a schematic diagram of an example simulation model of a MTJ-integrated SRR, excited by a copper microstrip feed line.

Operation of the example MTJ-integrated SRR 100 may be verified by finite-element simulation. FIG. 5 is a schematic diagram of an example simulation model of a MTJ-integrated SRR 100, excited by a copper microstrip feed line (e.g., of width 2.75 mm and thickness of 5 μm) 410. In the simulation model, a test resistor 510 (e.g., with resistance of 0.1 Ohm) is connected across the MTJ element 110 to represent a load to which the harvested DC current from the MTJ would flow. The MTJ element 110 is modeled as a rectangular element (e.g., with a resistance of 2000 Ohm). The space between the microstrip feed line 410 and the conductor ring is substantially 0.1 mm. Two microstrip ports are connected to the opposite ends of the microstrip feed line 410 and the transmission characteristics of the line simulated.

Figure 6A:
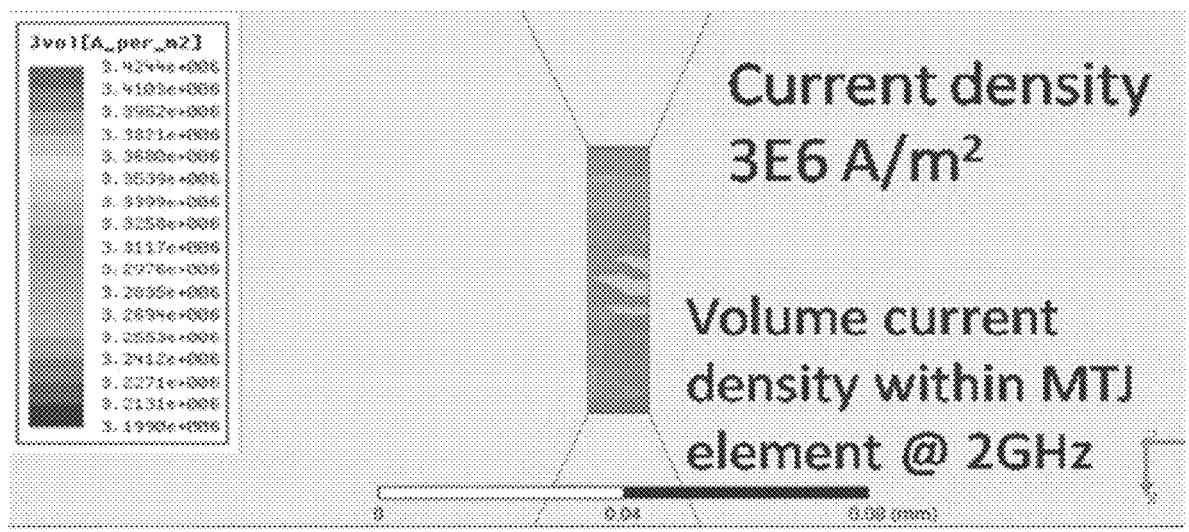
FIGS. 6A-C are diagrams and graphs of simulation results of the example simulation model of FIG. 5.
Figure 6B:
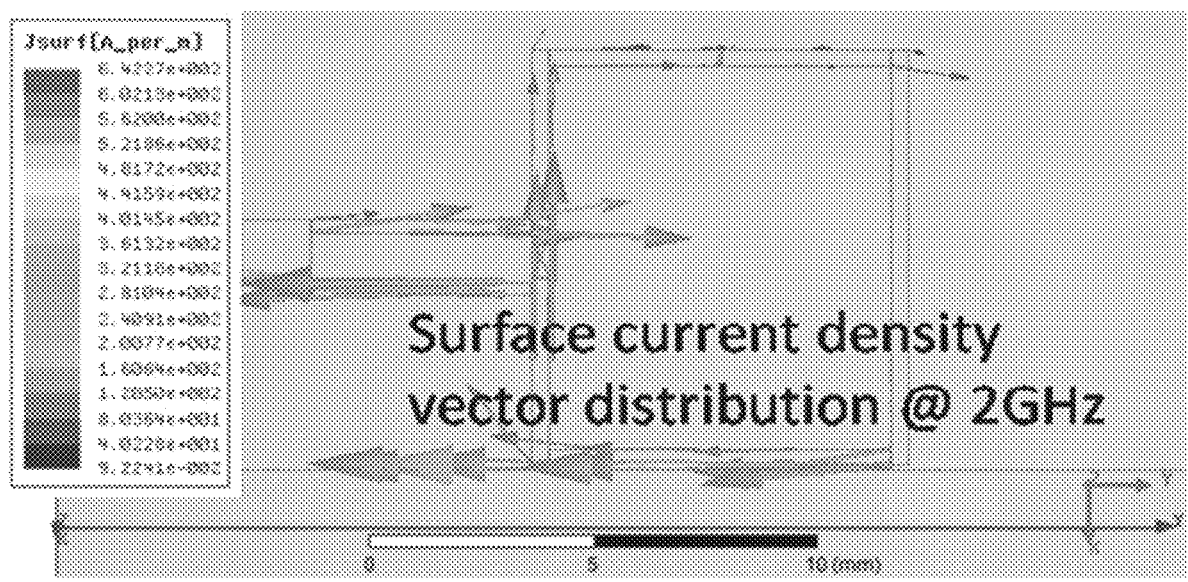
Figure 6C:
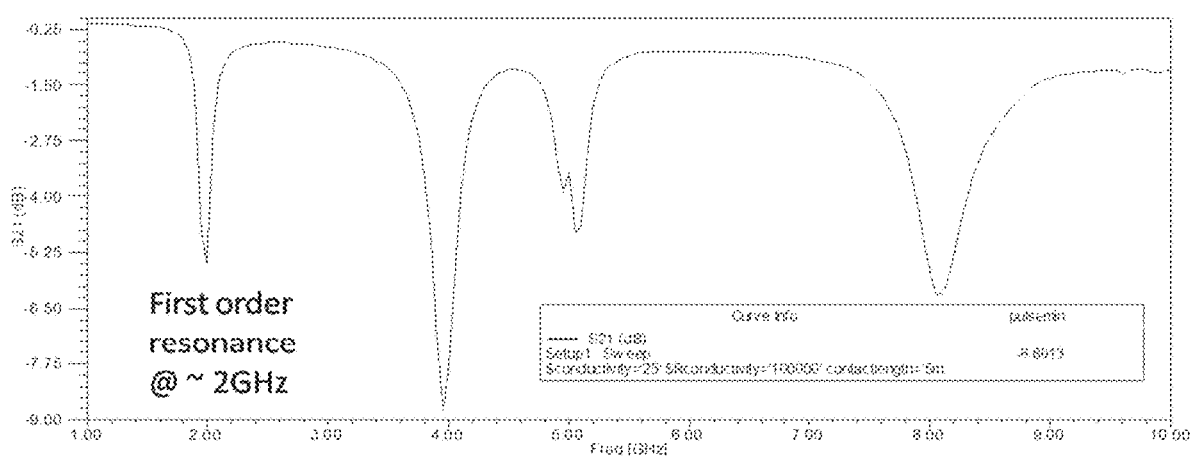

FIGS. 6A-C are diagrams and graphs of simulation results of the example simulation model of FIG. 5. Specifically, FIG. 6A is a diagram showing simulated volume micro current density within the MTJ element 110. FIG. 6B is a diagram showing surface current density vector distribution.

FIG. 6C is a graph showing transmission line characteristics from 1-10 GHz. The simulation results show that the first order resonance for the MTJ-integrated SRR 100 occurs at around 2 GHz, with a current density within the MTJ element 110 of around 3.6E6 A/m$^2$.

Figure 7A:
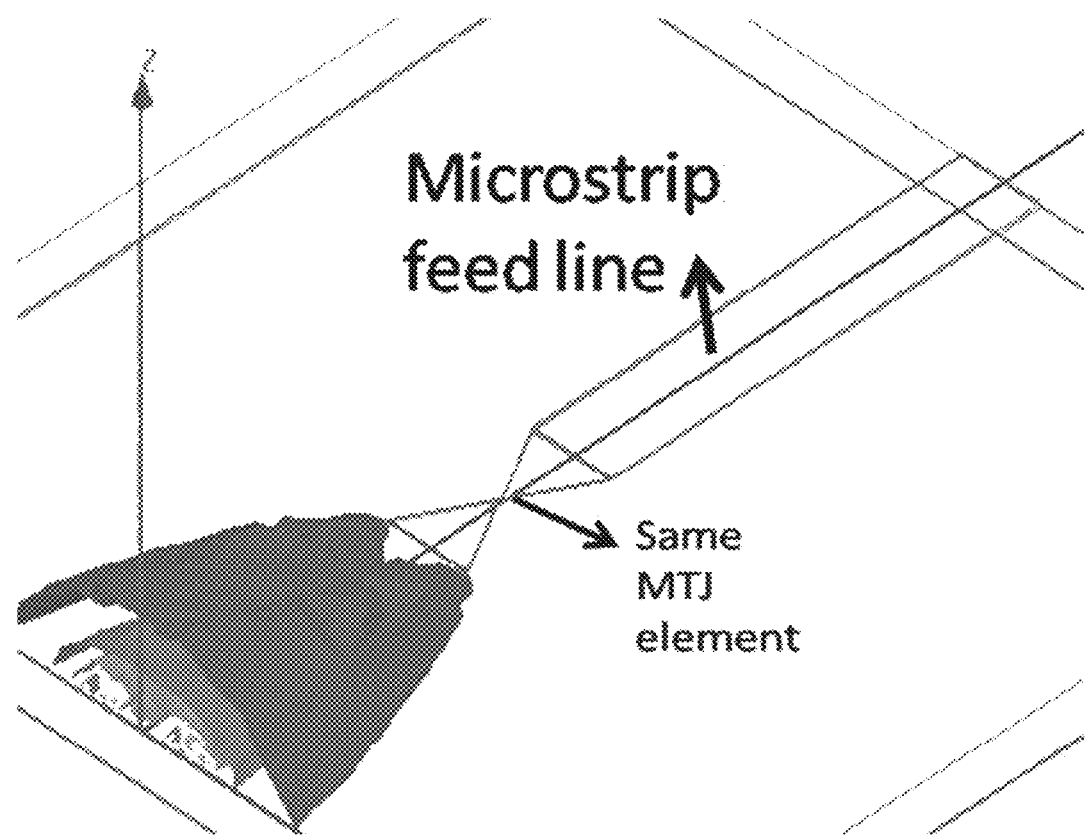
FIGS. 7A-7C are diagrams and graphs of simulation results showing simulation for a case the same MTJ element of FIGS. 6A-6C is directly fed by a microstrip feed line, with ports connected to the opposite ends of the microstrip feed line.
Figure 7B:
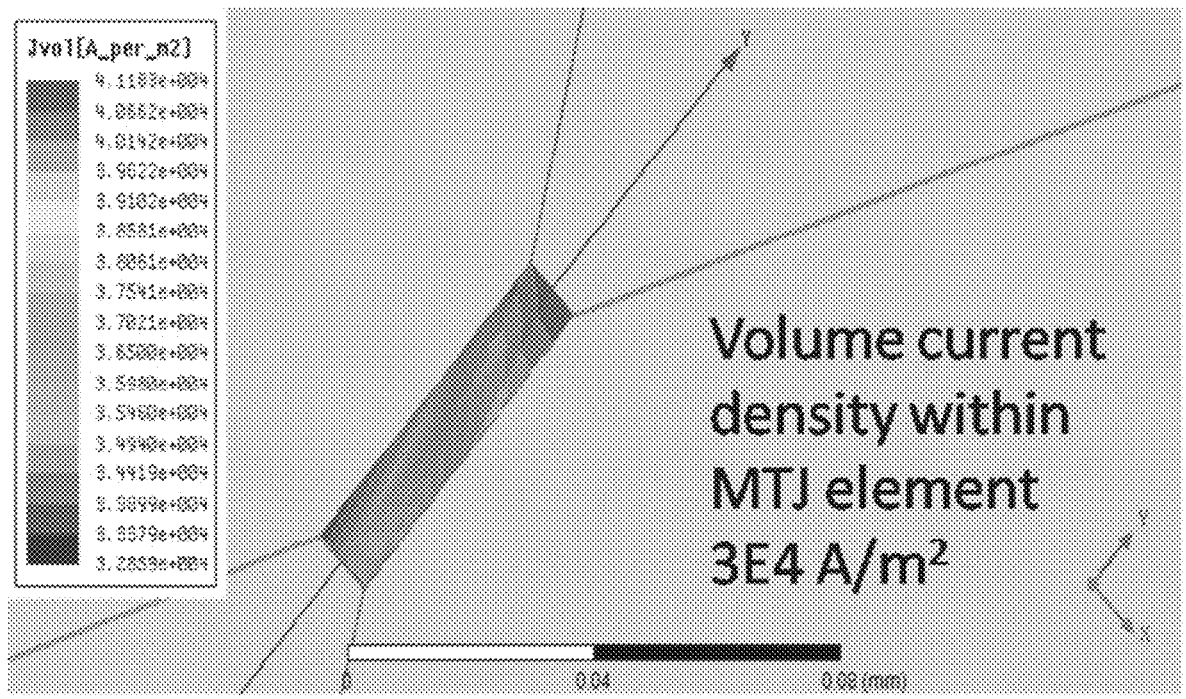
Figure 7C:
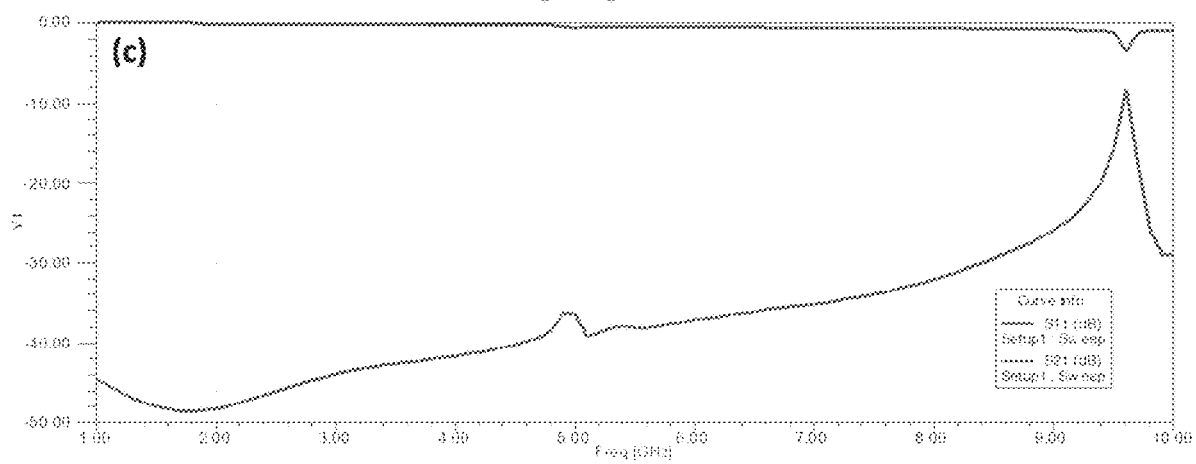

To emphasize the merits of such a MTJ-integrated SRR structure over a simple structure in which the MTJ is fed directly by a transmission line, simulation may be conducted with the MTJ element 110 being directly fed by a microstrip feed line. FIGS. 7A-7C are diagrams and graphs of simulation results showing simulation for a case the same MTJ element 110 of FIGS. 6A-6C is directly fed by a microstrip feed line, with ports connected to the opposite ends of the microstrip feed line. Specifically, FIG. 7A is a diagram showing a microwave fed directly into the MTJ element 110. FIG. 7B is a diagram of volume micro current density within the MTJ element 110. FIG. 7C is a graph showing transmission line characteristics from 1-10 GHz. One can see that for this case, the input microwave power is mostly reflected (e.g., due to impedance mismatch between the 50 Ohm feed line and the 2000 Ohm MTJ element). Consequently, the current density within the MTJ element 110 for this case is only 3E4 A/m$^2$, which is 2 orders of magnitude lower than that for the MTJ-integrated SRR 100. These results thus show that the MTJ-integrated SRR is not only able to circumvent the impedance mismatch issue, but also able to provide a much larger feed current into the MTJ element 110 at resonance.

Operation of the MTJ element 110 to convert harvested RF energy into DC power may be further considered. A DC current/voltage appears across the first (e.g., top) and bottom (e.g., bottom) electrode of the MTJ element 110, which can be harvested via electrical leads to power a load (e.g., represented by the test resistor 510 in above discussed simulation model). The ability to tap this DC current/voltage is assured due to the presence of the gap 150 that prevents current shunting of this DC voltage, while allowing AC resonance for maximum RF absorption.

It has been shown that a MTJ can be used as a rectifier to convert a RF energy into a DC power in a process referred to as the spin-torque diode (STD) effect. In the STD effect, a sinusoidal microwave current injected into the MTJ excites a magnetization precession in the magnetic layers via spin-torque transfer, resulting in tunnelling magneto-resistance (TMR) oscillations that rectify with the microwave current to produce a DC current. It has been shown that MTJ-based rectifiers can achieve sensitivities (e.g., upwards of 12,000 mV mW$^{-1}$ or even 75,400 mV mW$^{-1}$) that are far higher than even the theoretical thermodynamic limit (e.g., 4000 mV mW$^{-1}$) for conventional Schottky diodes at low input microwave powers. The high sensitivity of STD is mainly attributed to the highly efficient spin-torque spin excitation by RF current, which can be achieved even under zero magnetic field bias. Further, MTJs have the potential to be far more compact than Schottky diodes. The actual MTJ of a MTJ element 110 may be a nano-pillar of a few hundred nanometres or less in diameter, while a Schottky diodes is typically on the order of millimetres.

The rectification mechanism in a MTJ is very different than that in a Schottky diode. Current density passing through the MTJ J may be given as:

$$J = J_{dc} + J_{ac} \cos(2\pi f t) \quad (1)$$

where $J_{dc}$ and $J_{ac}$ are the applied DC current and AC microwave current respectively. When the current density J passes through the MTJ fixed layer/MgO/free layer stack 312, 314, 316, oscillations of the free layer 312 generate free layer spins $\hat{m}$, which in turn results in oscillations of the TMR. The TMR oscillations then rectify with the AC microwave at the same frequency to give rise to a DC voltage. The dynamics of the free layer spins $\hat{m}$ is given by the Landau-Lifshitz-Gilbert-Slonczewski (LLGS) equation:

$$\frac{d\hat{m}}{dt} = -\gamma \hat{m} \times \vec{H}_{eff} + \alpha \hat{m} \times \frac{d\hat{m}}{dt} + \frac{\gamma J \hbar P}{2eM_s d(1+P^2 \cos\beta)} [\hat{m} \times (\hat{e}_p \times \hat{m}) - b\hat{m} \times \hat{e}_p] \quad (2)$$

where γ is the gyromagnetic ratio, d is the free layer thickness, e is the electronic charge, $\hbar$ is the reduced Planck's constant, P is the spin polarization, β is the angle between the fixed and free layer magnetization and b is the ratio of the in-plane spin-torque (ST) $\vec{\tau}_{IP}$ and out-of-plane (OOP) field-like ST $\vec{\tau}_{OOP}$ magnitudes, and $\hat{e}_p$ is the unit vector in the direction of the fixed magnetization. Here, the effective field $\vec{H}_{eff}$ is given as:

$$\vec{H}_{eff} = \vec{H} + (1/\mu_0 M_s) dE/d\hat{m} + \Delta H_s \cos(2\pi f t) \cos\theta \quad (3)$$

where $\vec{H}$ is the applied static field, $\Delta H_s$ is voltage-controlled magnetic anisotropy (VCMA), $\mu_0$ is the permeability and E is the magnetic energy. The VCMA field $\Delta H_s$ may act like an AC field torque at frequency f to drive the spin precession, in addition to AC $\vec{\tau}_{IP}$ and $\vec{\tau}_{OOP}$ driving torques induced by the microwave current $J_{ac}$. The spin polarization P is related to the MTJ resistance R by:

$$R^{-1} = G_0(1 + P^2 \cos\beta) \quad (4)$$

where $G_0$ is the mid-point conductance.

Because of the spin-torque term (3$^{rd}$ term in equation (2), the excitation of $\hat{m}$ oscillations can be highly efficient for nano-scale MTJs with a large TMR value, resulting in large amplitude resistance oscillations that rectify the microwave current to a large DC voltage, giving rise to a high sensitivity for AC-to-DC conversion that can far exceed that of semiconductor Schottky diodes.

Figure 8A:
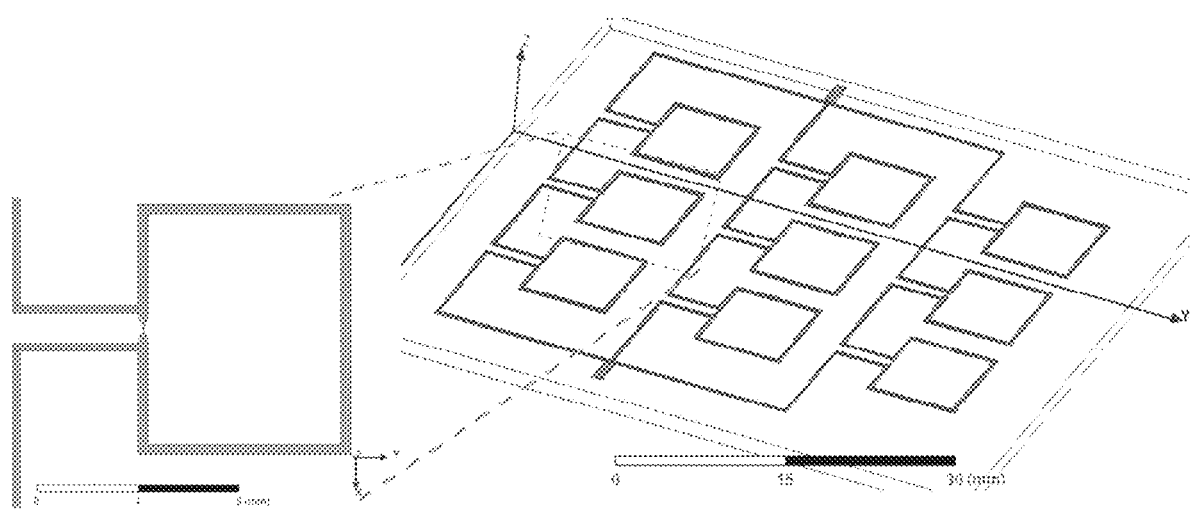
FIGS. 8A-C are diagrams of an example RF-to-DC converter incorporating a 3-by-3 array of MTJ-integrated SRR unit cells.
Figure 8B:
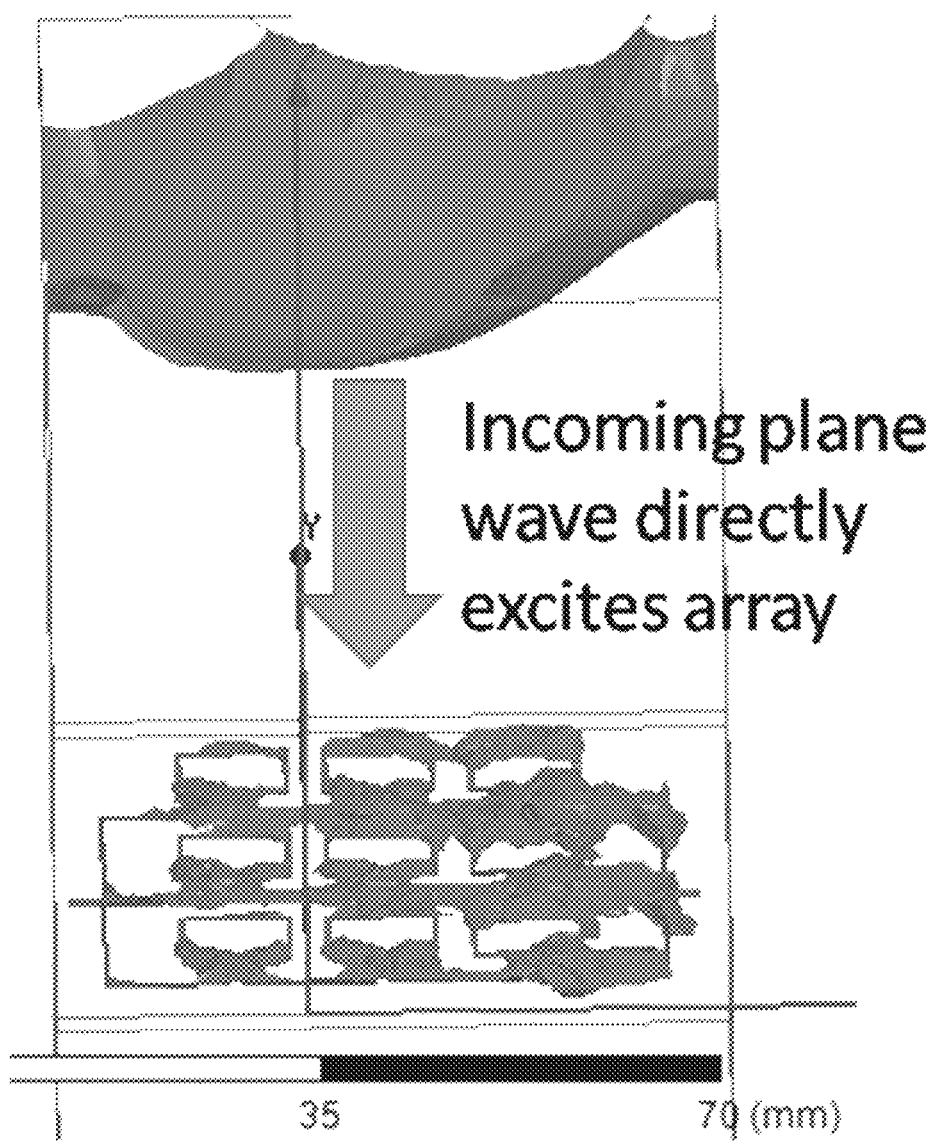
Figure 8C:
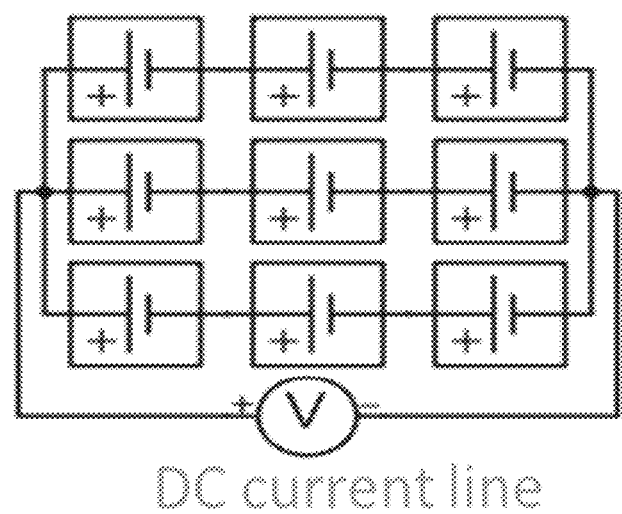

One or more MTJ-integrated SRRs 100 may be utilized as unit cells of a RF-to-DC converter to enable scaling. The MTJ-integrated SRR unit cells may be organized into an array with parallel and series elements. FIGS. 8A-C are diagrams of an example RF-to-DC converter incorporating a 3-by-3 array of MTJ-integrated SRR unit cells. Specifically, FIG. 8A is a diagram of a 3-by-3 array of MTJ-integrated SRR unit cells, with an insert that shows an expanded view of a unit cell. FIG. 8B is a diagram showing an incoming plane wave from a source (e.g., 10 cm away) normally incident onto and exciting the 3-by-3 array. FIG. 8C is a diagram of an equivalent power cell representing the 3-by-3 array. In the example shown in FIGS. 8A-C, the DC output of each unit cell is electrically connected such that they complement each other to increase the overall DC output across the leads, equivalent to a power source consisting of three parallel branches of three batteries connected in series. It should be understood that a wide variety of series and parallel configurations may also be utilized. Likewise, the number of unit cells may vary depending on the implementation. As may be observed, one advantage of an array based RF-to-DC converter is that the RF wave can directly excite the structure without the need for antennas/waveguides to collect the incident RF energy.

Figure 9A:
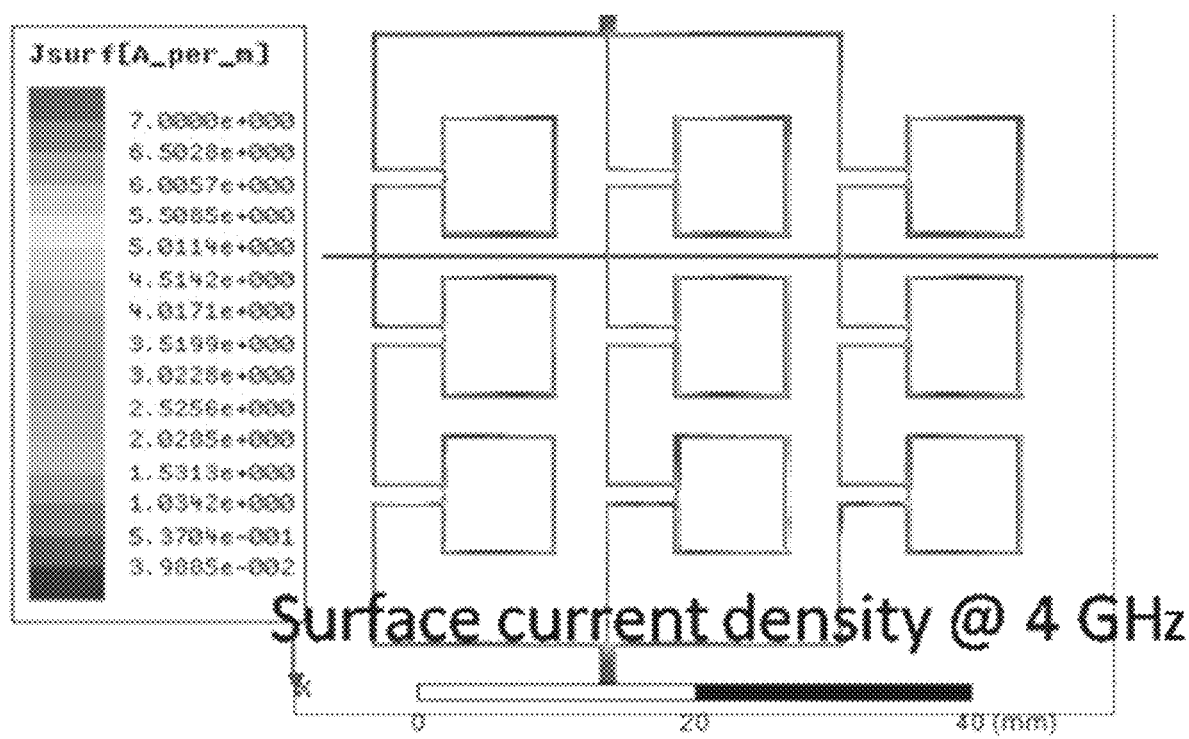
FIGS. 9A-C are diagrams and graphs of simulation results of the example RF-to-DC converter incorporating a 3-by-3 array of MTJ-integrated SRR unit cells of FIGS. 8A-C.
Figure 9B:
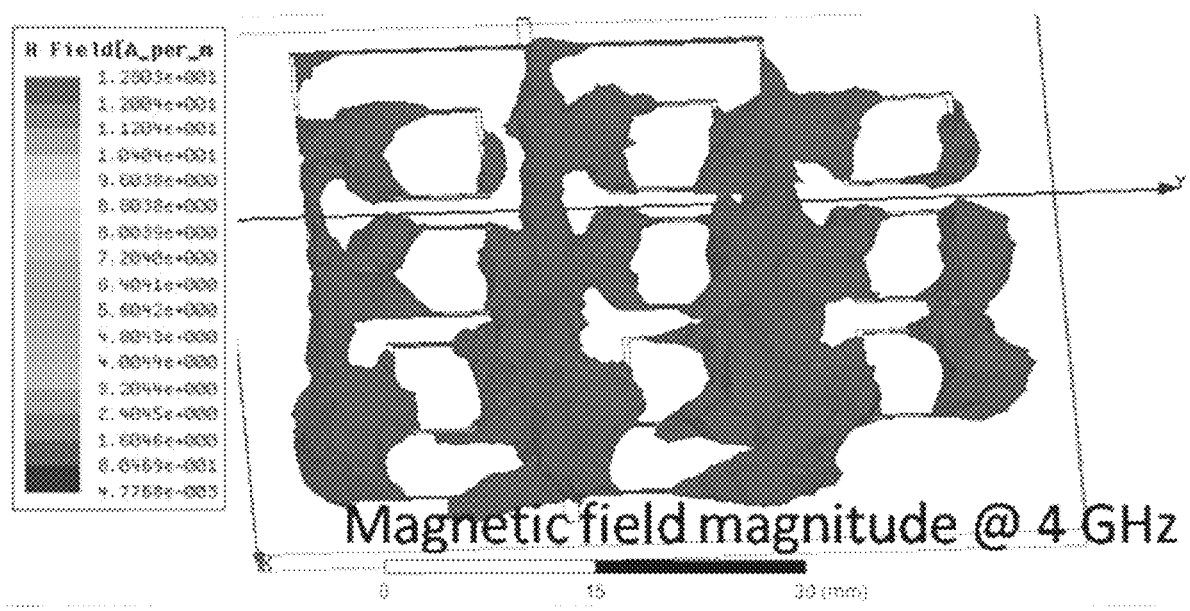
Figure 9C:
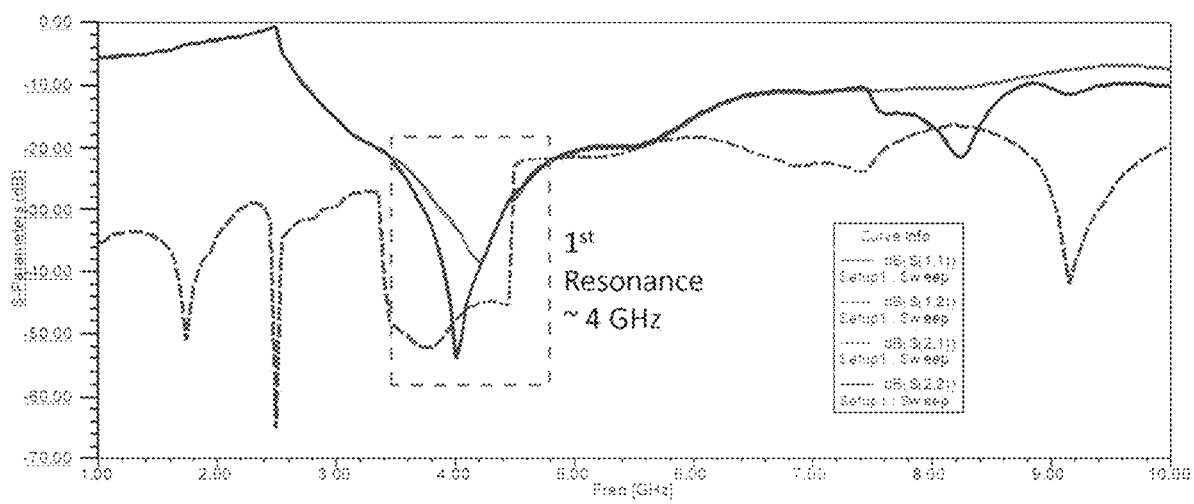

To test an RF-to-DC converter that includes an array of MTJ-integrated SRR unit cells, simulations may be performed. FIGS. 9A-C are diagrams and graphs of simulation results of the example RF-to-DC converter incorporating a 3-by-3 array of MTJ-integrated SRR unit cells of FIGS. 8A-C. Specifically, FIG. 9A is a diagram showing simulated surface current density at 4 GHz. FIG. 9B is a diagram showing magnetic field magnitude at 4 GHz. FIG. 9C is a graph showing S-parameters from 1-10 GHz. In the simulation a first port was placed 10 cm above the surface of the array, and a second port placed 10 cm below. As can be seen, the first-order resonance of the structure is at around 4 GHz, where reflection and transmission coefficients are minimized, indicating maximum power absorption by the array.

It should be understood that various adaptations and modifications may be made to the above-discussed RF-to-DC converter that includes one or more MTJ-integrated SRRs. Various elements described above may be made from differing materials, substituted for different elements, implemented in different combinations or otherwise arranged or used differently without departing from the intended scope of the disclosure. Example embodiments are not necessarily mutually exclusive as some may be combined with one or more others to form new example embodiments. Figures are not drawn to scale and relative relationships in size may be exaggerated for clarity in presentation. The example embodiments are, therefore, to be considered in all respects to be illustrative and not restrictive.

What is claimed is:

1. A radio frequency (RF)-to-direct current (DC) converter includes one or more magnetic tunnel junction (MTJ)-integrated split-ring resonator (SRR) unit cells, wherein each MTJ-integrated SRR unit cell comprises:
    a conductor ring for absorbing RF energy, the conductor ring having
       a first electrode,
       a second electrode, and
       a gap that electrically uncouples the first electrode and second electrodes from each other; and
    a MTJ element for converting absorbed RF energy to DC power, the MTJ element electrically connected to the first electrode and the second electrode, the MTJ element including an MTJ that covers at least a portion of an area of the MTJ element.

2. The RF-to-DC converter of claim 1, wherein the RF-to-DC converter includes a plurality of MTJ-integrated SRR unit cells arranged in an array.

3. The RF-to-DC converter of claim 2, wherein the array comprises two or more MTJ-integrated SRR unit cells electrically coupled in parallel and two or more MTJ-integrated SRR unit cells electrically coupled in series.

4. The RF-to-DC converter of claim 1, wherein the MTJ is structured as a layer stack that includes an active layer that comprises:
    a free magnetic layer;
    a fixed magnetic layer; and
    an oxide layer that separates the free magnetic layer and the fixed magnetic layer.

5. The RF-to-DC converter of claim 4, wherein the free magnetic layer and the fixed magnetic layer are cobalt iron boron alloy (CoFeB) layers, and the oxide layer is a magnesium oxide (MgO) layer.

6. The RF-to-DC converter of claim 4, wherein the layer stack further comprises:
    a first synthetic anti-ferromagnet layer; and
    a second synthetic anti-ferromagnet layer,
    wherein the first synthetic anti-ferromagnet layer and the second synthetic anti-ferromagnet layer are separated by the active layer positioned in-between.

7. The RF-to-DC converter of claim 4, wherein the MTJ is electrically isolated from elements other than the first electrode and the second electrode by one or more passivation layers.

8. The RF-to-DC converter of claim 1, wherein the RF-to-DC converter further includes one or more transmission feed lines for inductively feeding RF energy to the one or more MTJ-integrated SRR unit cells.

9. A magnetic tunnel junction (MTJ)-integrated split-ring resonator (SRR), comprising:
    a conductor ring having
       a first electrode,
       a second electrode, and
       a gap that electrically uncouples the first electrode and second electrodes from each other; and
    a MTJ element electrically connected to the first electrode and the second electrode, the MTJ element including an MTJ that covers at least a portion of an area of the MTJ element.

10. The MTJ-integrated SRR of claim 9, wherein the MTJ is structured as a layer stack that includes an active layer that comprises:
    a free magnetic layer;
    a fixed magnetic layer; and
    an oxide layer that separates the free magnetic layer and the fixed magnetic layer.

11. The MTJ-integrated SRR of claim 10, wherein the free magnetic layer and the fixed magnetic layer are cobalt iron boron alloy (CoFeB) layers, and the oxide layer is a magnesium oxide (MgO) layer.

12. The MTJ-integrated SRR claim 10, wherein the layer stack further comprises:
    a first synthetic anti-ferromagent layer; and
    a second synthetic anti-ferromagent layer,
    wherein the first synthetic anti-ferromagnet layer and the second synthetic anti-ferromagnet layer are separated by the active layer positioned in-between.

13. The MTJ-integrated SRR of claim 10, wherein the MTJ is electrically isolated from elements other than the first electrode and the second electrode by one or more passivation layers.

14. The MTJ-integrated SRR of claim 10, wherein the MTJ-integrated SRR is part of a radio frequency (RF)-to-direct current (DC) converter that includes a plurality of MTJ-integrated SRR unit cells arranged in an array.

15. The MTJ-integrated SRR of claim 10, wherein the MTJ-integrated SRR is arranged adjacent to a transmission feed line configured to inductively feed radio frequency (RF) energy to the MTJ-integrated SRR.

16. A method for radio frequency (RF)-to-direct current (DC) conversion using one or more magnetic tunnel junction (MTJ)-integrated split-ring resonator (SRR) unit cells, comprising:
    applying RF energy to a gapped conductor ring of each MTJ-integrated SRR unit cell with a plane wave or transmission feed line, the applying to produce an RF current in the conductor ring;
    converting the RF current into a DC current by spin-torque diode (STD) effect in an MTJ of each MTJ-integrated SRR unit cell that is coupled to a first electrode and a second electrode of the conductor ring of the respective MTJ-integrated SRR unit cell; and
    harvesting DC current from the first electrode and the second electrode of each MTJ-integrated SRR unit cell.

17. The method of claim 16, wherein the converting by the STD effect comprises:
   injecting a sinusoidal microwave current into the MTJ of each MTJ-integrated SRR unit cell;
   exciting a magnetization precession in magnetic layers of the MTJ of each MTJ-integrated SRR unit cell via spin-torque transfer; and
   producing tunnelling magneto-resistance (TMR) oscillations which rectify with the microwave current to produce the DC current.

18. The method of claim 16, wherein the one or more MTJ-integrated SRR unit cells are a plurality of MTJ-integrated SRR unit cells arranged in an array, and the method further comprises:
   combining the harvested DC current electrode of each MTJ-integrated SRR unit cell through parallel and/or series electrical connections.

19. The method of claim 16, wherein the MTJ of each of each MTJ-integrated SRR unit cell is structured as a layer stack that includes an active layer that comprises:
   a free magnetic layer;
   a fixed magnetic layer; and
   an oxide layer that separates the free magnetic layer and the fixed magnetic layer.

20. The method of claim 19, wherein the layer stack further comprises:
   a first synthetic anti-ferromagent layer; and
   a second synthetic anti-ferromagent layer,
   wherein the first synthetic anti-ferromagnet layer and the second synthetic anti-ferromagnet layer are separated by the active layer positioned in-between.

\* \* \* \* \*